United States Patent
Yoon

(10) Patent No.: US 6,201,537 B1
(45) Date of Patent: *Mar. 13, 2001

(54) SOUND CONTROL CIRCUIT AND METHOD USING MICROCOMPUTER

(75) Inventor: An-Sung Yoon, Suwon-si (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/873,290

(22) Filed: Jun. 11, 1997

(30) Foreign Application Priority Data

Jun. 11, 1996 (KR) .................................. 96-20848
May 16, 1997 (KR) .................................. 97-18833

(51) Int. Cl.$^7$ ..................................... G06F 9/40
(52) U.S. Cl. ......................... 345/327; 345/302; 345/14
(58) Field of Search .................... 345/302, 327, 345/14, 13, 10; 395/2; 381/57, 56, 107, 104, 110, 123, 109, 94.8; 340/815.46, 815.47, 815.48, 815.49

(56) References Cited

U.S. PATENT DOCUMENTS

| | | | | |
|---|---|---|---|---|
| 4,340,908 | * | 7/1982 | Wakabayashi et al. | 358/194 |
| 4,553,257 | * | 11/1985 | Mori et al. | 82/1.11 |
| 4,661,994 | * | 4/1987 | Tanaka et al. | 455/157.2 |
| 5,081,682 | * | 1/1992 | Kato et al. | 364/528.1 |
| 5,161,198 | * | 11/1992 | Noble | 381/81 |
| 5,191,620 | * | 3/1993 | Lee | 381/105 |
| 5,309,517 | * | 5/1994 | Barclay | 381/119 |
| 5,477,262 | * | 12/1995 | Banker et al. | 348/7 |
| 5,481,616 | * | 1/1996 | Freadman | 381/90 |
| 5,528,255 | * | 6/1996 | Hagimori | 345/35 |
| 5,557,724 | * | 9/1996 | Sampat et al. | 345/327 |
| 5,579,397 | * | 11/1996 | Ikeda et al. | 381/113 |
| 5,581,626 | * | 12/1996 | Palmer | 381/103 |
| 5,617,478 | * | 4/1997 | Tagami et al. | 381/56 |
| 5,666,426 | * | 9/1997 | Helms | 381/57 |
| 5,670,972 | * | 9/1997 | Kim | 345/13 |
| 5,771,301 | * | 6/1998 | Fuller et al. | 381/107 |
| 5,793,874 | * | 8/1998 | Camire | 381/57 |
| 5,796,847 | * | 8/1998 | Kaihotsu et al. | 381/57 |
| 5,799,036 | * | 8/1998 | Staples | 375/222 |
| 5,832,438 | * | 11/1998 | Bauer | 704/270 |
| 5,850,560 | * | 12/1998 | Kang | 395/750.06 |
| 5,864,702 | * | 1/1999 | Walsh et al. | 395/750 |
| 5,887,147 | * | 3/1999 | Arai et al. | 395/286 |

* cited by examiner

Primary Examiner—William A. Cuchlinski, Jr.
Assistant Examiner—Marthe Marc-Coleman
(74) Attorney, Agent, or Firm—Robert E. Bushnell, Esq.

(57) ABSTRACT

A sound control circuit in a display device includes a microcomputer for generating variable signals corresponding to the amount changed in duty cycle of pulse width modulation output when a sound function key is selected. A sound amplifier control circuit is for controlling sound output through a speaker based on control signals such as voice signal output level and sound mute generated by the microcomputer. A sound output unit generates sound after changing input sound based on the output signal generated by the sound amplifier control circuit. A multiplexer turns on a light emitting diode and switching a microphone according to the control signal generated by the microcomputer.

20 Claims, 10 Drawing Sheets

SOUND CONTROL CIRCUIT AND METHOD USING MICROCOMPUTER

CLAIM OF PRIORITY

This application makes reference to, incorporates the same herein, and claims all benefits accruing under 35 U.S.C. §119 from an application entitled Sounds Control Circuit and Method Using Microcomputer earlier filed in the Korean Industrial Property Office on Jun. 11, 1996, and there duly assigned Serial No. 96-20848, and on May 16, 1997, and there duly assigned Serial No. 97-18833 by that Office.

BACKGROUND OF THE INVENTION

1. Field of the Invention

The present invention relates to a display device with a sound control function aside from a general function of the display device. Specifically, this invention is a sound control circuit and method using a microcomputer in conjunction with the display device.

2. Discussion of Related Art

Today, computers are rapidly changing the work environment; the very circumstances for application of a computer are being developed. For example, various usages of multi-media are affecting our daily lives. As the various kinds of sound software are utilized in a multi-media computer, display devices corresponding to the multi-media which contains a sound amplifier and a speaker other than a display function, are developed and produced in many various ways. As well as the usual functions, sound control functions such as volume control, sound mute, and microphone ON/OFF are added to the display device, and they are controlled by a special sound circuit. Frequently, a sound signal transmitted by the output terminal of a computer sound card is applied to the sound amplifier through a special sound circuit in the display device.

When controlling such the sound functions, noise and pop problems can occur. Also, when using an internal condenser microphone, howling (shrill sound and stripes on the screen of the display device) is caused by interference of speaker signals. This annoys users. Of course, such a machine that annoys users is at heavy disadvantage and causes problems in technical and commercial acceptance.

SUMMARY OF THE INVENTION

Accordingly, an object of the present invention is to provide an improved sound control circuit and method using a microcomputer.

Another object of the present invention is to provide a sound control circuit and method using a microcomputer for controlling the sound and the relevant functions of a display device by using tactile keys installed on its external surface.

To achieve these and other advantages, a sound control circuit using a microcomputer includes a microcomputer for generating variable signals corresponding to the amount as much as changed in duty (i.e. duty cycle) of pulse width modulation (PWM) output when any sound function key is selected. A sound amplifier control circuit is for controlling sound output through a speaker based on the control signals such as voice signal output level and a sound mute generated by the microcomputer. A sound output unit generates sound resulting from changing sound input based on the output signal generated by the sound amplifier control circuit. A multiplexer controls lighting of a light emitting diode and controls switching of a microphone.

BRIEF DESCRIPTION OF THE ATTACHED DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENT

Reference will now be made in detail to the preferred embodiments of the present invention, examples of which are illustrated in the accompanying drawings.

Figure 1:
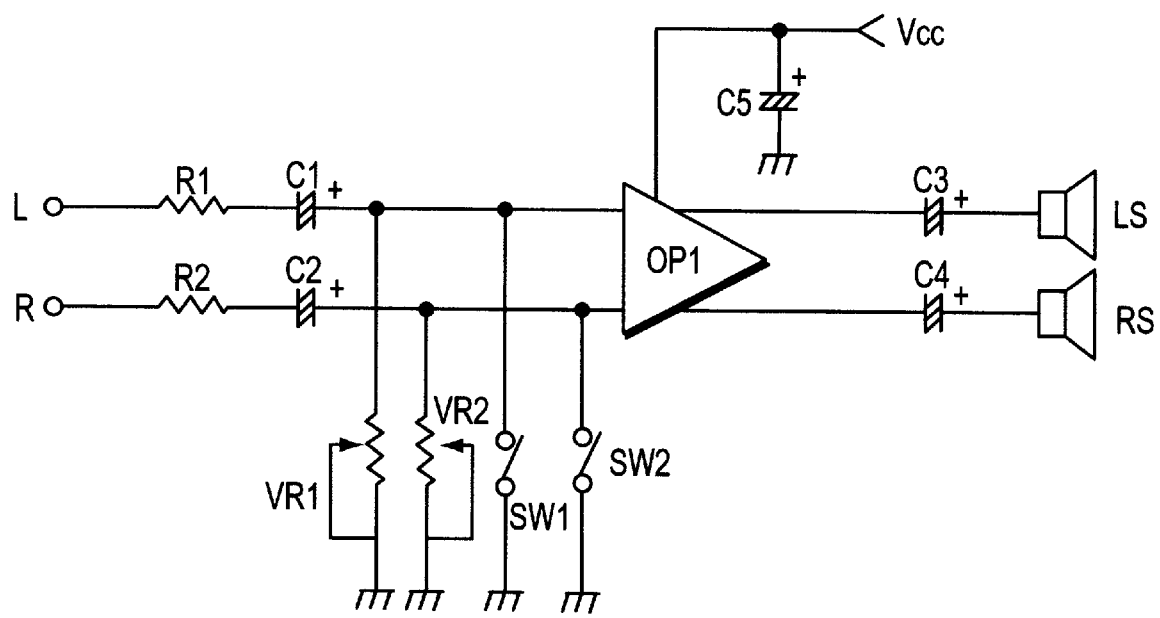
FIG. 1 is a circuit diagram of a contemporary sound control circuit.

Turning now to the drawings, a contemporary sound control circuit is shown in FIG. 1. The sound signal transmitted by the output terminal of a computer sound card is applied to the sound amplifier OP1 via a special sound circuit in the display device. The signal amplified by the sound amp OP1 is sent out by using left and right speakers LS and RS. Output volume is controlled by changing a sound input of alternating current (AC) property using volumes VR1 and VR2 at input terminals. Sound mute is switched using mute switches SW1 and SW2. When controlling such the sound functions, noise and pop problems may occur. Also, when using an internal condenser microphone, howling may occur; howling is caused by interference of speaker signals.

There is another way. The present invention permits a sound control circuit and method using a microcomputer in conjunction with the display device. The microcomputer, which determines the switching between the general monitor function and sound control function, generates control signals for a voice signal output level, sound mute function and microphone switching. The microcomputer then controls a sound amplifier for amplification and a light emitting diode using the control signals. Sound volume can be controlled by rectifying duty cycle of variable width in a PWM pulse of the microcomputer, thus generating the sound volume of direct current (DC). Pop problems in sound mute is solved by controlling the PWM output of the microcomputer. Howling occurring when using an internal condenser microphone is eliminated by maintaining the present sound at a constant level to minimize the interference with the speaker.

Therefore, optimal transmission is achieved in signals from the display device to a computer. The present invention also enables the user to easily recognize the states of volume, mute, and microphone by displaying the results of sound control through an on screen display (OSD). This invention illustrates whether the sound mute or microphone function is selected through light emitting diode (LED).

Figure 2:
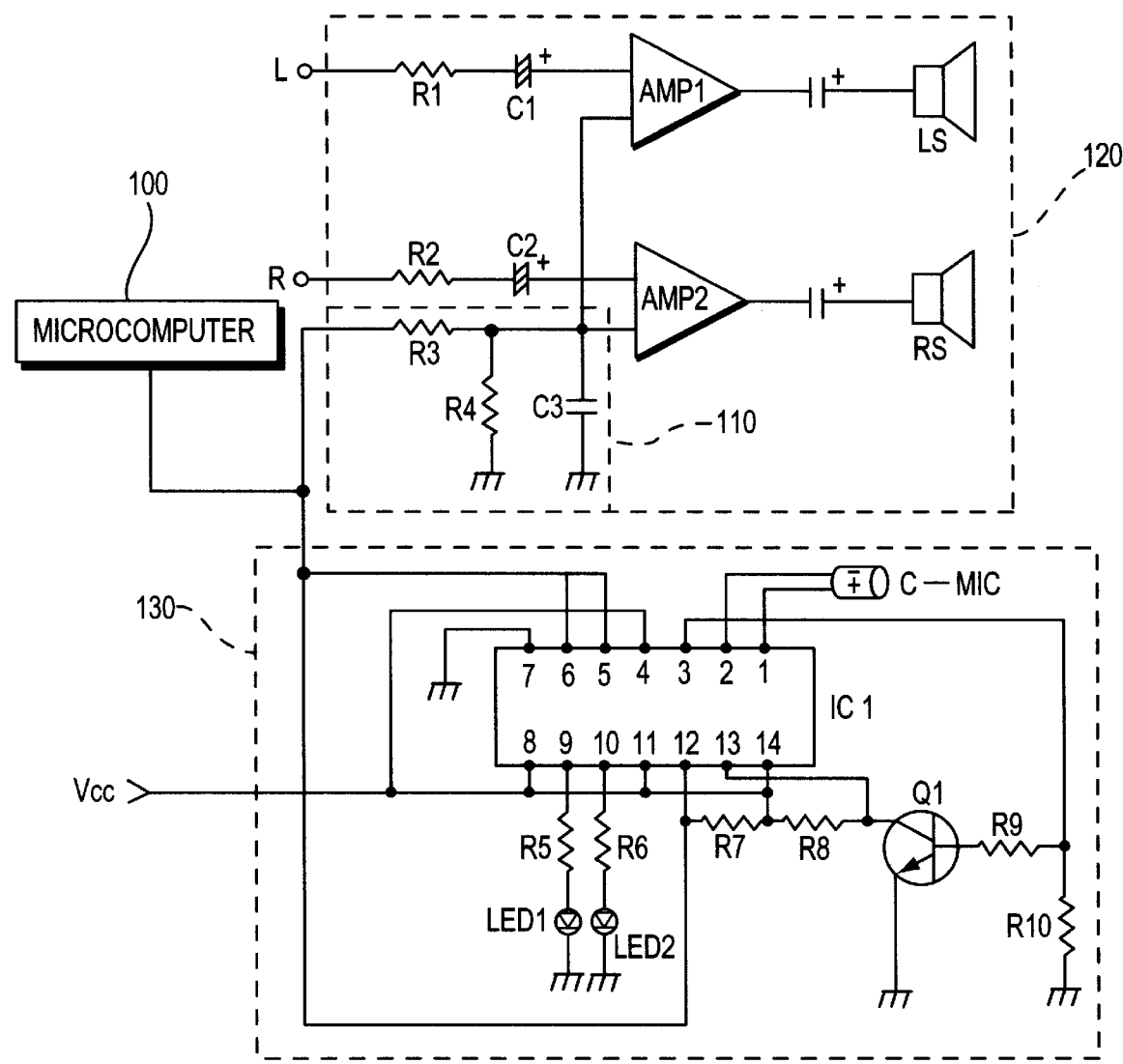
FIG. 2 is a circuit diagram of a sound control circuit according to the present invention.

FIG. 2 shows a typical circuit built along the idea stated in the previous paragraphs. A sound control circuit includes: sound amplifier control circuit 110 for detecting control signals generated by microcomputer 100 through the PWM output port; sound output unit 120 for changing the sound input according to the output signal of the sound amplifier control circuit 110; and LED & C-mic control unit 140 for lighting light emitting diodes LED1 and LED2 and switching a microphone C-MIC according to the control signal generated by microcomputer 100.

Sound amplifier control circuit 110 may include PWM control signal detection resistor R3 for detecting the control signal transmitted through the output port of microcomputer 100; dividing resistor R4; and rectifying capacitor C3.

Sound output unit 120 may include resistors R1 and R2 for detecting the sound signal transmitted from a sound card in a multi-media computer though not shown in the drawings; coupling capacitors C1 and C2; sound amplifiers AMP1 and AMP2; and speakers LS and RS for sending out the sound amplified by the sound amplifiers.

Multiplexer 130 includes the pins number 1 and 2 are connected to a condenser microphone C-MIC. Pin number 3 generates operation switching signals for the condenser microphone C-MIC. Resistors R9 and R10 detect and divide the switching signals. Transistor Q1 is opened or closed by the divided voltage received through its base, thus controlling the operation of the condenser microphone C-MIC. Pins 9 and 10 are respectively connected to light emitting diodes LED1 and LED2, which display the conditions of a microphone and sound mute function, through resistors R5 and R6 which transmit the signals to the diodes.

The operation of an sound control circuit using the microcomputer in accordance with the present invention can be as follows. Microcomputer 100 in a display device, according to programmed data, generates signals whose pulse widths were adjusted when any sound function key is entered. The signals are rectified by resistors R3 and R4, and capacitor C3 at a constant DC level, then transmitted to amplifiers AMP1 and AMP2 in sound output unit 120. The controlled sound input signals are transmitted to speakers. As is shown, the signals generated by entering the sound function keys, such as volume up/down, microphone on/off, sound mute or sound level control, are adjusted by the amount of a PWM output from the sound amplifier circuit.

Figure 3:
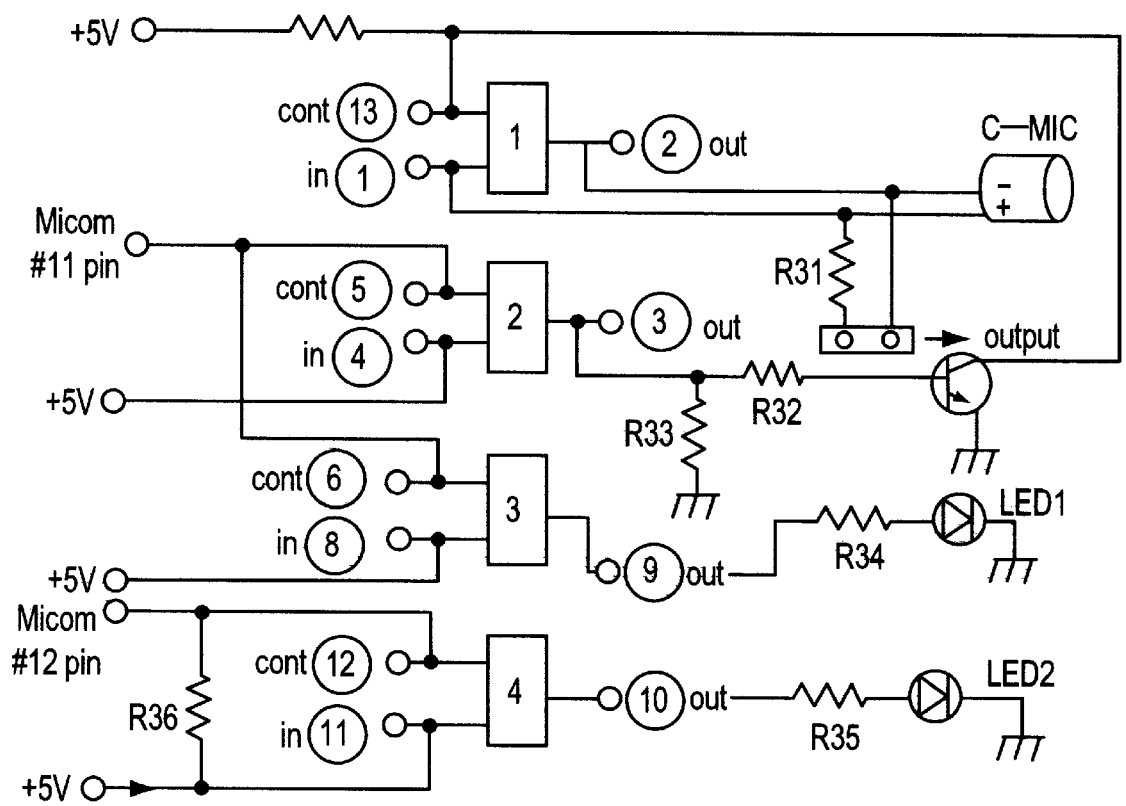
FIG. 3 is a circuit diagram of the multiplexer shown in FIG. 2.

FIG. 3 is a circuit diagram illustrating signal systems. FIG. 3 shows the operation of multiplexer 130. At an initial state, a "HIGH" signal is applied to the pin numbered 13, thus the pins numbered 1 and 2 are shorted and the condenser microphone C-MIC cannot operate. When the condenser microphone C-MIC is "ON", the "ON" signal is transmitted to the pins numbered 11 by microcomputer 100. The pins numbered 3 and 4 become "ON" by the pin numbered 5, thus electric power is applied to the base of transistor Q1, and the output of the pin numbered 13 becomes "LOW". The pins 1 and 2 then go "OFF", so the condenser microphone C-MIC operates. The electric power transmitted through the pins numbered 8 and 9 controls the operation of LED 1 displaying the operation state of the microphone. A sound mute signal is transmitted to the pin numbered 12 by microcomputer 100. The signal makes the output signal of the pin numbered 10 "ON" using driving electric power transmitted to the pin numbered 11, thus lighting LED2.

Figure 4:
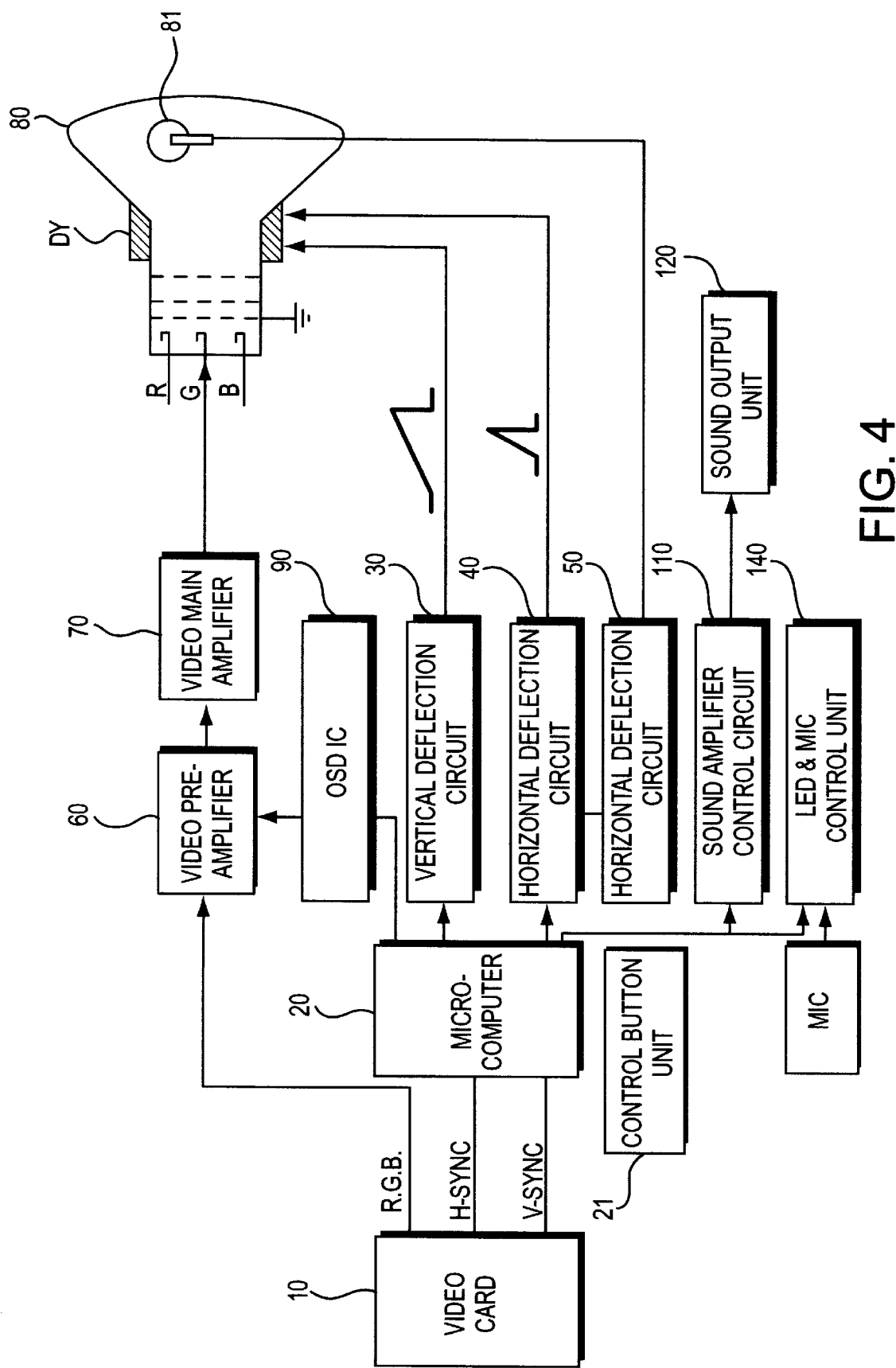
FIG. 4 is a block diagram illustrating the display device according to the present invention.

FIG. 4 is a block diagram of the display device according to the present invention. As shown in FIG. 4, a computer (not shown in the drawings) contains video card 10 which provides color signals (R, G, B) and horizontal and vertical sync signals (H_Sync/V_Sync) required for forming image. Microcomputer 20 receives the horizontal and vertical sync signals from video card 10 and generates control signals for controlling the monitor screen. Horizontal and vertical deflection circuits 30 and 40 receive the horizontal and vertical sync signals and perform horizontal and vertical deflection where the electron beam formed in an electron gun is deflected by a deflection yoke (DY) in the pattern of series lines progressing from the left top to the right bottom in a cathode-ray tube (CRT) 80, thus forming a complete picture. High voltage circuit 50 supplies high voltage to the anode in CRT 80 using retrace pulses generated from the output terminal of horizontal deflection circuit 40, based upon the principle of switching circuit and technology on high voltage. Video preamplifier 60 amplifies weak video signals (R, G, B) transmitted by video card 10 to make the signals maintained at a predetermined voltage level using a low voltage amplifier. Video main amplifier 70 amplifies the signals previously amplified by video pre-amplifier 60 up to 40 to 60 Vpp, thus supplying energy to each pixel. OSD-IC 90 supplies information on the display device functions and states through letters displayed on the screen according to the selection signal from microcomputer 20. A sound amplifier control circuit 110 controls sound output through a speaker based on control signals such as voice signal output level and sound mute generated by the microcomputer. A sound output unit 120 generates sound after changing input sound based on the output signal generated by the sound amplifier control circuit. A LED & C-mic control unit 140 controls a light emitting diode and switches a microphone according to the control signal generated by the microcomputer. The display device also contains control button unit 21 which transmits image adjustment signals to microcomputer 20 when the user pushes. Control button unit 21 consists of image control keys and sound control keys. Since this invention relates to sound control, the sound control keys are chiefly described below.

Figure 5:
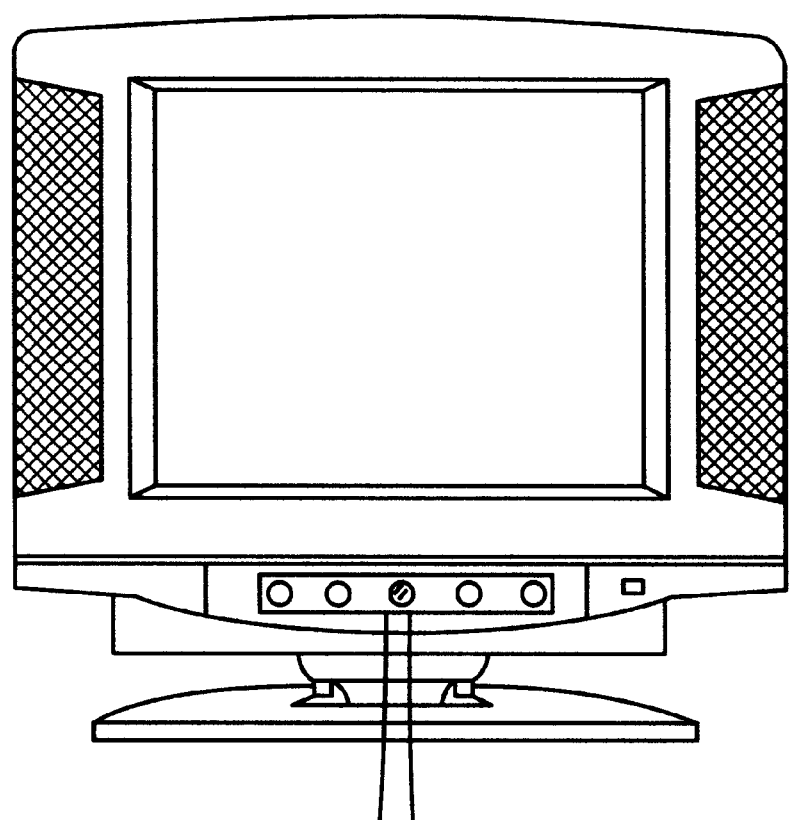
FIG. 5 illustrates the outer appearance of a display device according to the present invention.
Figure 5:
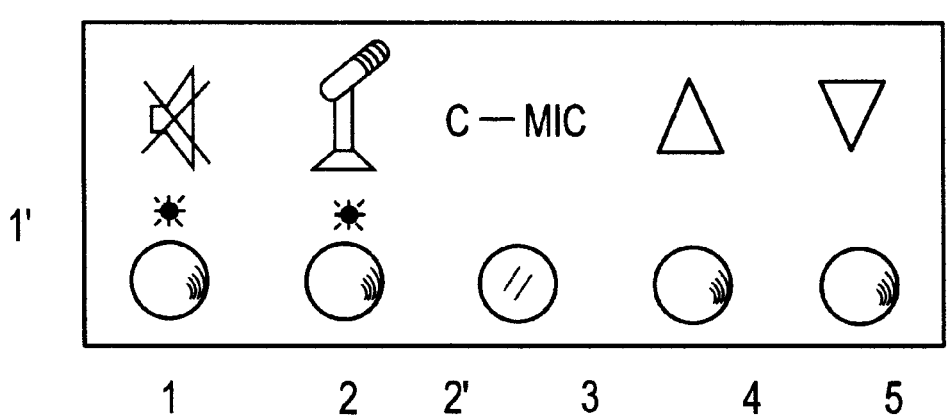
Figure 6:
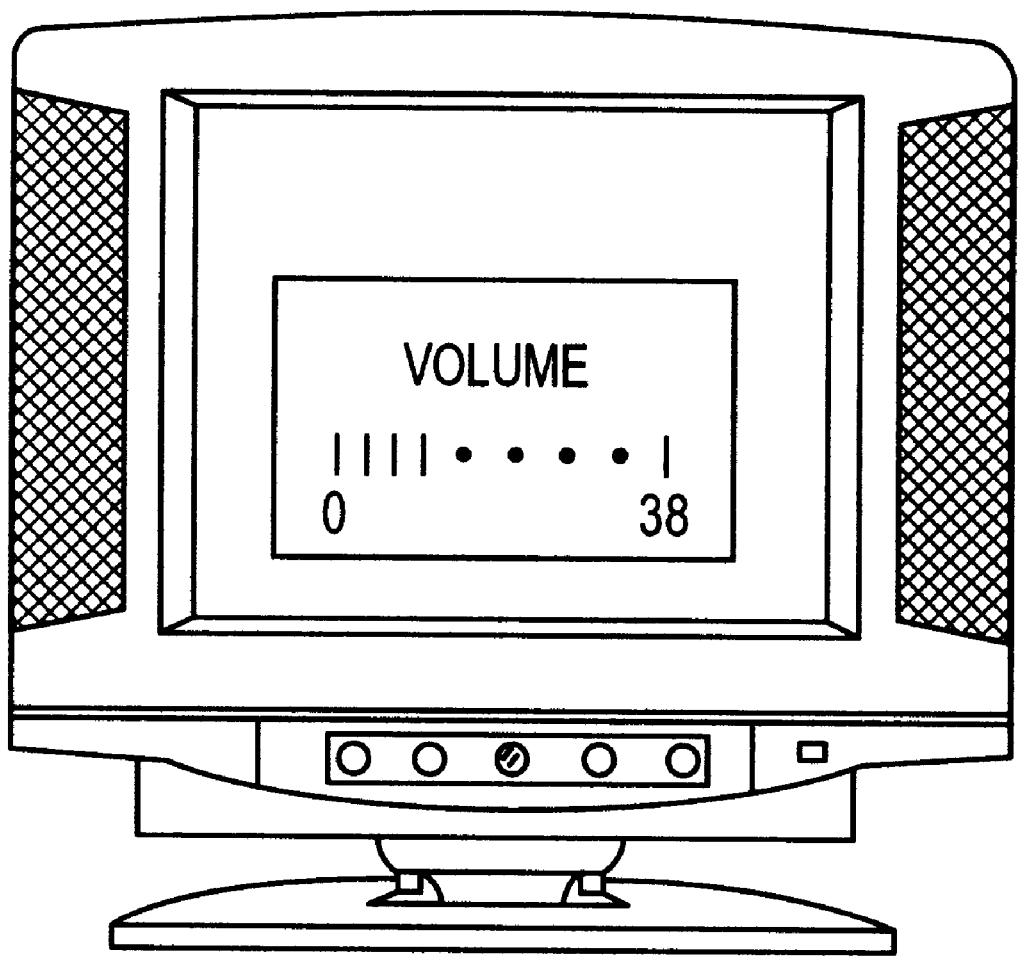
FIG. 6 shows an example of an on-screen display according to the present invention.

FIG. 5 shows the outer appearance of a display device according to the present invention. As shown in FIG. 5, tactile switches utilized as the sound control keys are installed in the lower part of the front side in the display device. There are sound mute switch 1, microphone switch 2, light emitting diodes LED 1' and 2', microphone input 3, and volume up/down keys in the sound control keys. Sound mute and microphone switches 1 and 2 operate in a toggle manner that "ON/OFF" changes whenever the switches are pushed. When the sound mute and microphone functions are in use, respective LEDs 1' and 2' above the switches light to let the user notice. Once the switches 1, 2, 4, and 5 are pressed, the display device shows the on-screen display (OSD) to the user. If the user presses sound mute switch 1, message such as "MUTE ON" or "MUTE OFF" is illustrated on the screen. If the user presses microphone switch 2, a message such as "MIKE ON" or "MIKE OFF" becomes illustrated on the screen. When volume control keys 4 and 5 are pressed, OSD illustrates volume level with many bars and Arabic numerals as shown in FIG. 6. When there are such many volume levels to illustrate, so that the control intervals between the volume levels are narrow, the relevant memory is divided into a sound low memory and sound high memory for a finer control.

With reference to FIGS. 7 to 10, a signal transmission system under the control of the microcomputer is described below in detail.

Figure 7:
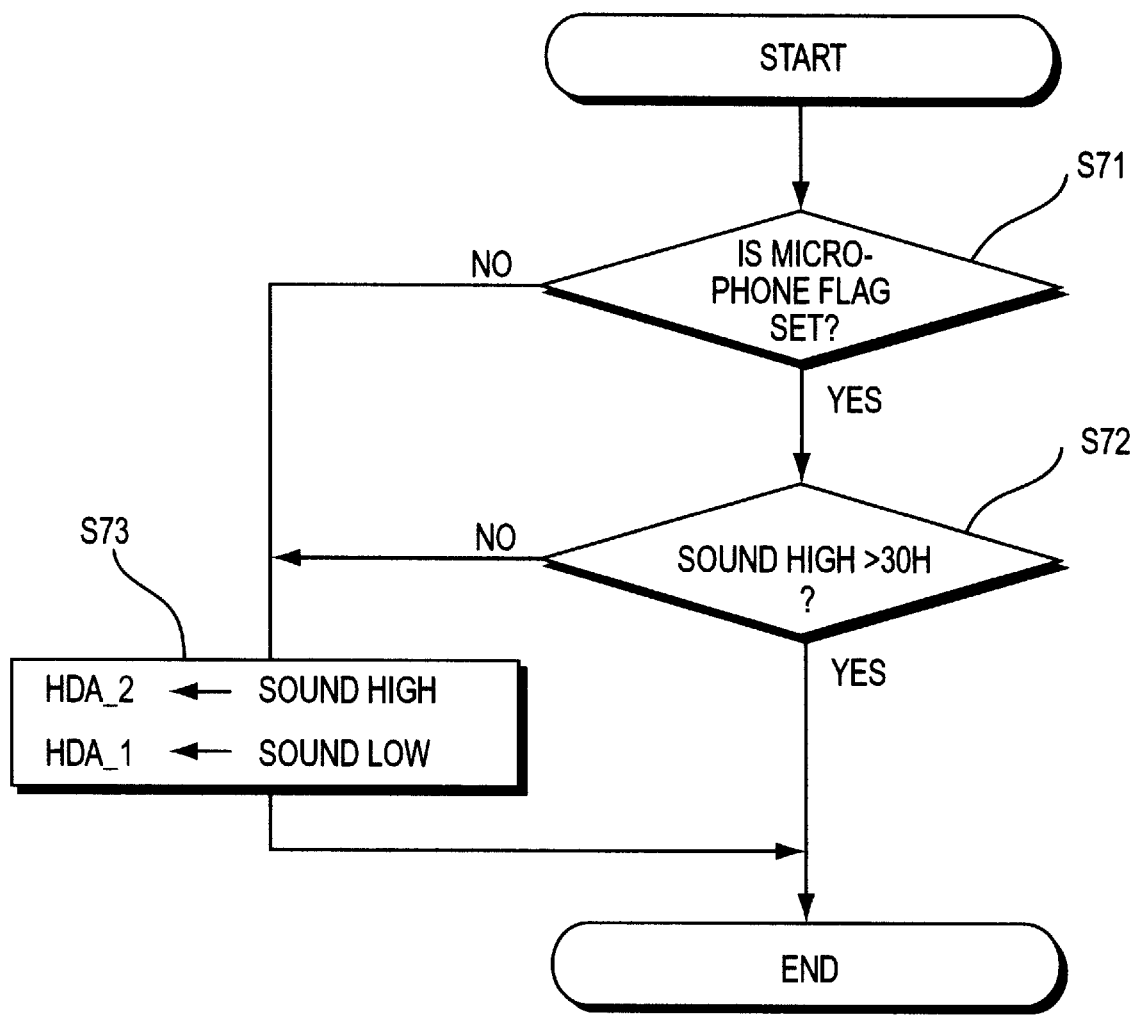
FIG. 7 is a flow chart illustrating one capability of a volume transmission according to the principles of the present invention.

As shown in FIG. 7, the volume transmission method may include: determining whether the microphone is "ON" or "OFF" (step S71); in case of "ON", determining whether a sound value exceeds 30H (step S72); and sending out the present sound value through a port (step S73). When the microphone is "OFF", the PWM of a sound value is sent out without special control. 30H does not represent an actual level of the sound but indicates the storage location for command or data according to the process of program. 30H is a boundary value between the sound low and sound high values. If the output value of the speaker is the value stored in 30H, howling caused by interference of the microphone can be prevented. When the speaker's output exceeds the value stored in 30H, there is a high probability that the howling occurs. When the microphone is set to be utilized, the output of the speaker is limited to 30H. Illustrated above, noise problem caused by the interference between the microphone and the speaker is solved after the condition of the microphone resulting from such the volume transmission is determined.

Figure 8A:
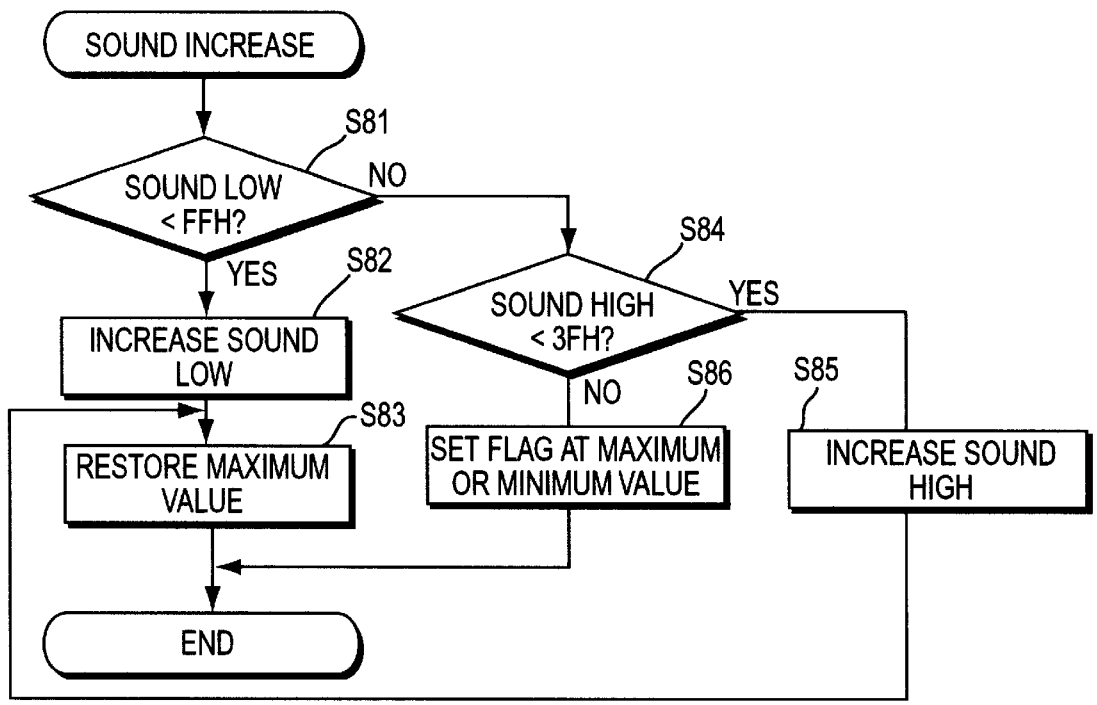
FIGS. 8A and 8B are flow charts illustrating some of capabilities of sound increase and decrease according to the principles of the present invention.
Figure 8B:
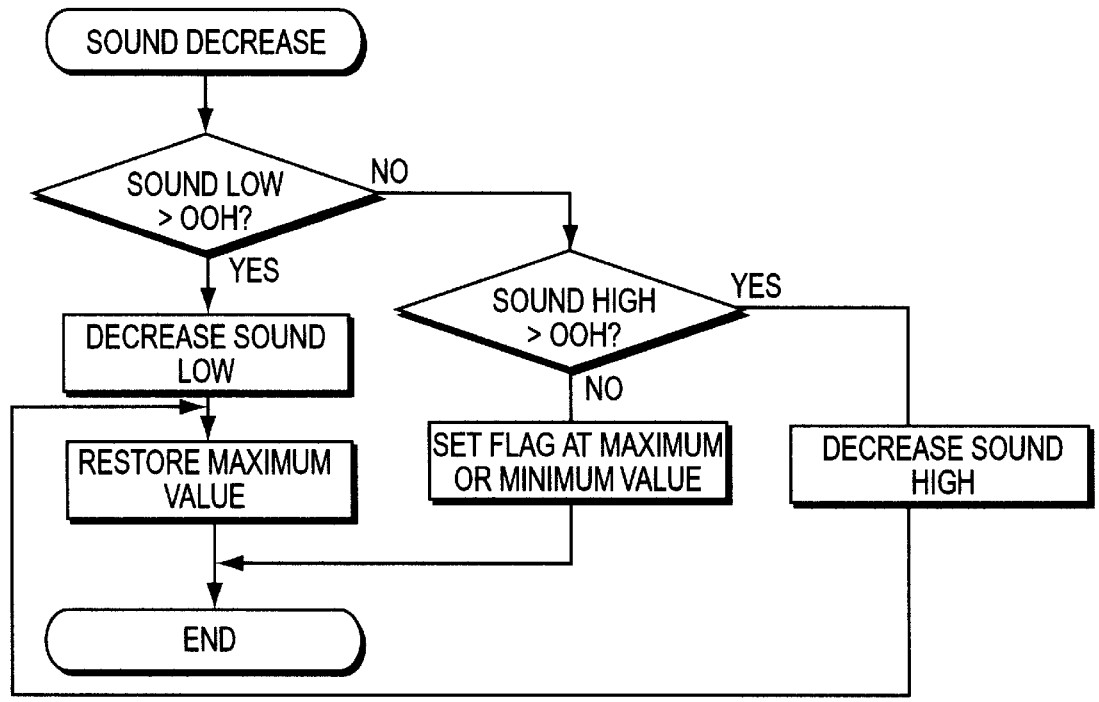

FIGS. 8A and 8B are flow charts illustrating sound increase and decrease carried out when pressing the volume switches 4 and 5. Sound variable value is sent as PWM through a sound port. As shown in FIG. 8A, the sound increasing process may include: detecting the address value of a sound low (step S81); increasing the sound low value (step S82); restoring a maximum sound value (step S83); determining the address value of a sound high (step S84); increasing the sound high value (step S85); and setting the sound limits (MAXMIN) (step S86). A sound decreasing process shown in FIG. 8B is oppositely analogous to the increasing process. Since the change of the present sound level during the sound increase or decrease is illustrated through the OSD as shown in FIG. 6, the user can easily recognize the necessary change.

Figure 9:
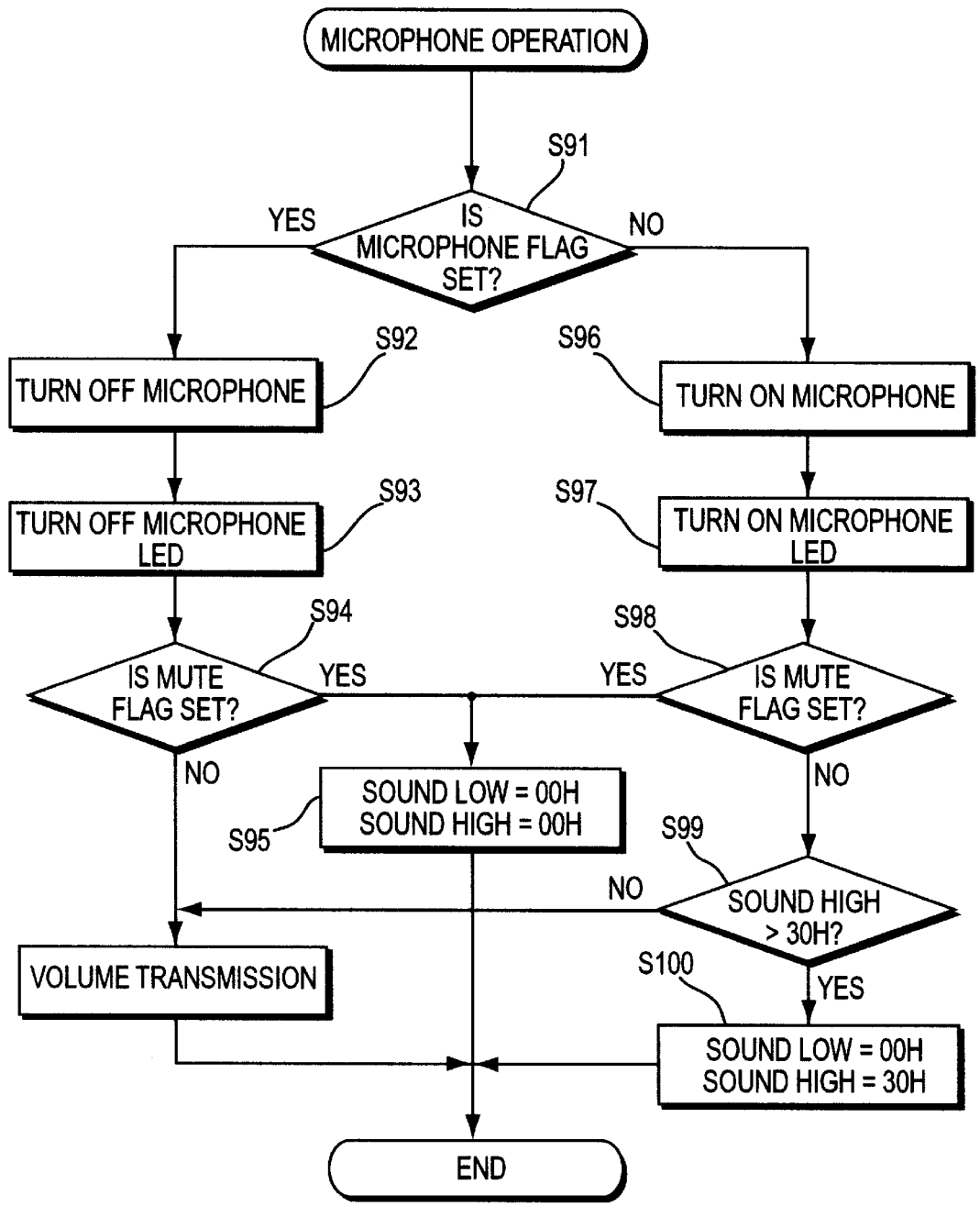
FIG. 9 is a flow chart illustrating one capability of a switch of a microphone according to the principles of the present invention.

FIG. 9 illustrates a flow chart of the microphone switching method. A microphone flag is determined (step S91). If the flag has already been set, then the flag is reset (step S92). This switching operates somewhat like a usual remote control switch, i.e., the ON/OFF is switched by repeatedly pressing the toggle switch. When the microphone switching signal is applied in the condition that the flag has already been set, the microphone becomes "OFF". Then, the light emitting diode displaying the state of the microphone is turned off (step S93). There is a determination as to whether or not a sound mute signal is set (step S94). When the signal is set at step S64, a "LOW" sound output value is generated to control the sound output (step S95). When the microphone flag has not been set at step S91, the flag is set (step S96), and the microphone light emitting diode is turned on (step S97). Whether or not a sound mute signal is set is determined (step S98). When the signal is set at step S98, a sound output value ("LOW" or "HIGH") is generated at 00H (step S95). When the sound mute is not set, the present sound value is detected (step S99). When the detected sound value exceeds 30H, the sound output value is decreased to 30H (step S100). The interference between a speaker and a microphone is decreased by decreasing the sound volume to 30H when the microphone is "ON".

Figure 10:
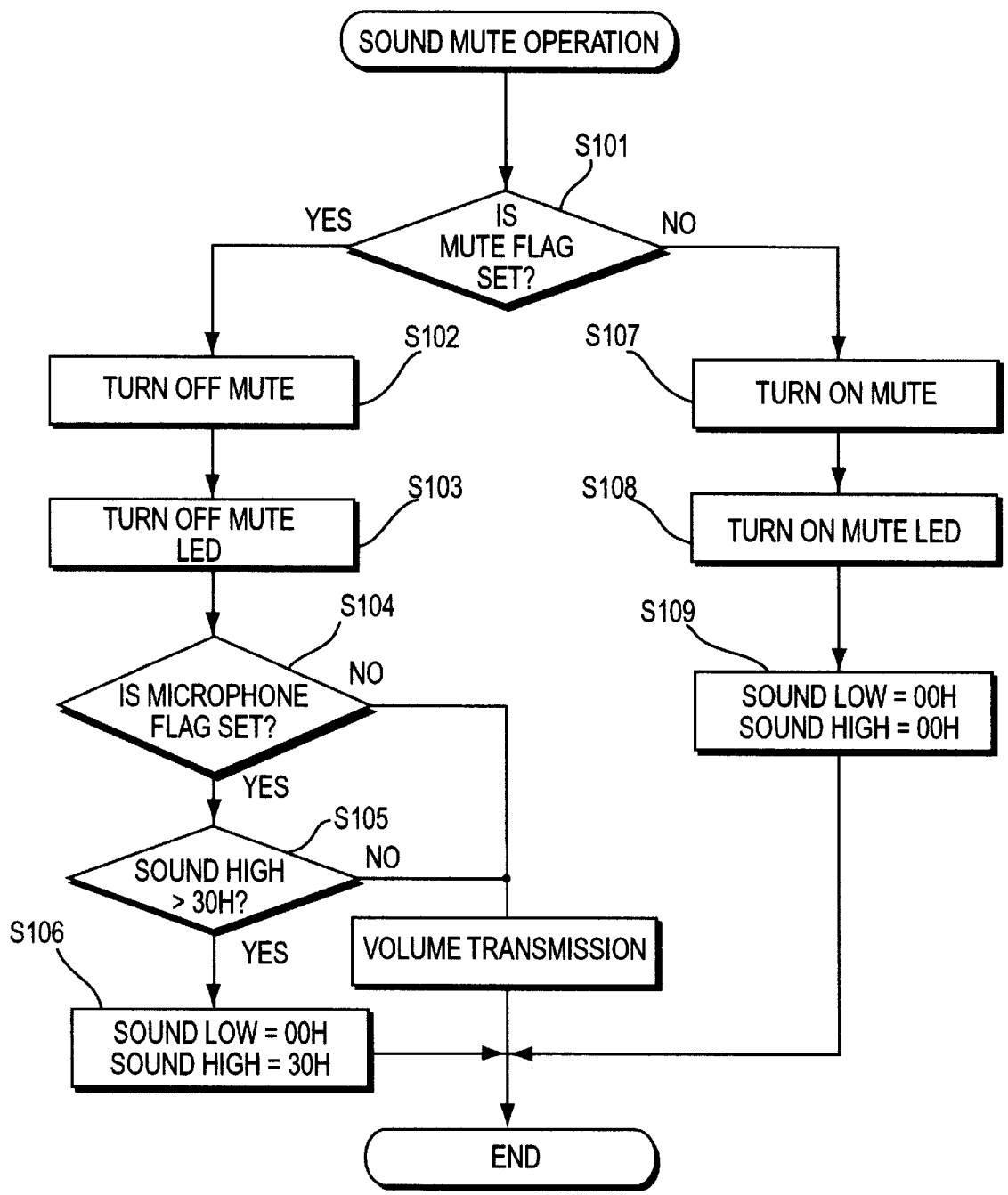
FIG. 10 is a flow chart illustrating one capability of a sound mute according to the principles of the present invention.

FIG. 10 is a flow chart of the sound mute method. Early on, there is a determination as to whether or not a sound mute flag is set. (step S101). When the sound mute flag has already been set, the flag is reset (step S102) and the light emitting diode LED2 is turned off (step S103). Whether or not the microphone is in use is determined (step S104). When the microphone is operated, a sound high value is detected (step S105). When the value exceeds 30H, the output value of the microphone is set at the value stored in 30H (step S106), so the interference by the speaker is decreased. When the sound mute function is not operated, the sound mute flag is set (step S107), and the light emitting diode LED2 is turned on (step S108). The "LOW" and "HIGH" sound values are set at the value stored at 00H to deaden the sound (step S109).

As stated in the previous paragraphs, the principles of the present invention teaches a microcomputer which detects the switching between monitor function control and sound control functions in a display device. The microcomputer generates control signals for voice signal output level, sound mute function and microphone switching. These control signals control sound amplifiers and light emitting diodes. Thus, the present invention effectively prevents noise and the interference with a speaker.

It will be apparent to those skilled in the art that various modifications and variations can be made in the sound control circuit and method of the present invention without deviating from the spirit or scope of the invention. Thus, it is intended that the present invention cover the modifications and variations of this invention provided they come within the scope of the appended claims and their equivalents.

What is claimed is:

1. In a display device comprising:
   a monitor having on-screen display of mute, microphone, condenser microphone, and volume control, said monitor having sound function keys for selection of a microphone, a speaker, a condenser microphone, and volume control to activate said on-screen display;
   a housing comprising a microcomputer generating pulse-width duty cycles when a sound function key is selected;
   a sound amplifier control circuit for controlling sound output through a speaker based on said pulse width duty cycles generated by said microcomputer; and
   a sound output unit for generating sound after changing input sound based on the output signal generated by the sound amplifier control circuit;
   the improvement comprising:
   a multiplexer for switching the microphone according to the control signal generated by the microcomputer, said multiplexer having means for decreasing said sound output when said sound output exceeds a predetermined level whereby howling is prevented.

2. The display device of claim 1, wherein said sound function keys are designed as soft switches and installed on the front surface of said monitor.

3. The display device of claim 1, wherein sound control values according to a control of the sound function keys are displayed through said on-screen display.

4. The display device of claim 3, wherein a sound level displayed through said on-screen display is illustrated using bars and Arabic figures.

5. The display device of claim 4, wherein a memory used for illustrating the sound level on the screen is divided into two frames.

6. The display device of claim 1, wherein said microcomputer controls the sound amplifier control circuit by changing an input sound signal into direct current.

7. The display device of claim 1, wherein ON/OFF operation of said microphone is controlled by a transistor switch by output signals generated by the multiplexer.

8. In a display device, comprising:
- a microcomputer to generate duty cycle difference signals when a sound function key is selected, the duty cycle difference signals corresponding to an amount of change in a duty cycle of a width of a pulse width modulation pulse of said microcomputer;
- a monitor having on-screen display of mute, microphone, condenser microphone, and volume control, said monitor having sound function keys for selection of a microphone, a speaker, a condenser microphone, and volume control to activate said on-screen display;
- an on-screen display circuit providing information and function of the display device using on-screen display letters according to selection signals from the microcomputer;
- a sound amplifier control circuit to control sound transmitted via a speaker, said sound amplifier control circuit controlling the sound transmitted via the speaker in dependence duty cycle difference signals generated by said microcomputer, the sound control signals including voice signals indicating voice, output level signals indicating output level, and sound mute signal controlling muting of sound; and
- a sound output unit to generate sound by changing sound received by said sound output unit, said sound output unit to generate sound based on an output signal generated by the sound amplifier control circuit;

the improvement comprising:
- a multiplexer having a condenser microphone, said multiplexer to switch operations of said condenser microphone in accordance with the control signals generated by the microcomputer, said multiplexer having means for decreasing an output level of said sound transmitted via a speaker when said output level exceeds a predetermined level, whereby howling is prevented.

9. The display device of claim 8, said multiplexer comprising:
- an integrated circuit connected to said microcomputer, said sound amplifier control unit, and said condenser microphone, said integrated circuit generating switching signals in dependence upon the control signals received from said microcomputer, the switching signals containing information regarding switching of operations of said condenser microphone.

10. The display device of claim 9, said multiplexer comprising:
- a plurality of diodes each connected to said integrated circuit; and
- a transistor having transistor leads connected to said integrated circuit, operating in independence upon voltage differences between the transistor leads connected to said integrated circuit.

11. The display device of claim 8, wherein the sound function keys are programmed using software and installed at a front surface of the display device.

12. The circuit of claim 8, wherein said on-screen display displays sound control values in accordance with selections of the sound function keys and indicates an operation state of the circuit.

13. The circuit of claim 8, wherein the microcomputer controls the sound amplifier control circuit by changing a sound signal into direct current.

14. The circuit of claim 8, wherein an on and off operation of the microphone is controlled by a transistor switched by transistor signals generated within the multiplexer.

15. A method for preventing howling in a display device comprising:
- a microcomputer to generate duty cycle difference signals when a sound function key is selected, the duty cycle difference signals corresponding to an amount of change in a duty cycle of a width of a pulse width modulation pulse of said microcomputer;
- a monitor having on-screen display of mute, microphone, condenser microphone, and volume control, said monitor having sound function keys for selection of a microphone, a speaker, a condenser microphone, and volume control to activate said on-screen display;
- an on-screen display circuit providing information and function of the display device using on-screen display letters according to selection signals from the microcomputer;
- a sound amplifier control circuit to control sound transmitted via a speaker, said sound amplifier control circuit controlling the sound transmitted via the speaker in dependence duty cycle difference signals generated by said microcomputer, the sound control signals including voice signals indicating voice, output level signals indicating output level, and sound mute signal controlling muting of sound;
- a sound output unit to generate sound by changing sound received by said sound output unit, said sound output unit to generate sound based on an output signal generated by the sound amplifier control circuit; and
- a multiplexer for switching operations of the microphone according to the control signal generated by the microcomputer;

said method comprising:
(1) storing at a memory location a datum corresponding to a predetermined sound-high level;
(2) comparing said predetermined sound-high level with a signal representative of the output level of the sound transmitted by the speaker; and
(3) when the level of the sound transmitted by the speaker exceeds the predetermined sound-high level, decreasing the level of the sound transmitted by the speaker.

16. The method of claim 15, further comprising the steps of:
(1) connecting an integrated circuit to said microcomputer, said sound amplifier control unit, and said condenser microphone, said integrated circuit generating switching signals in dependence upon the control signals received from said microcomputer, the switching signals containing information regarding switching of operations of said condenser microphone;
(2) connecting to said integrated circuit a first light emitting diode and a second light emitting diode;
(3) connecting to said integrated circuit leads of a transistor operating in dependence upon voltage differences between the transistor leads connected to said integrated circuit;
(4) connecting to said integrated circuit a first resistor connected to said transistor; and
(5) connecting to said integrated circuit and to said first resistor a second resistor connected receiving the switching signals from said integrated circuit and transmitting the switching signals to said transistor via said first resistor.

17. The method of claim 15, further comprising the steps of:
   (1) programming the sound function keys using software; and
   (2) installing the sound function keys at a front surface of the display device.

18. The method of claim 15, further comprising the steps of:
   (1) providing said on screen display with means for displaying sound control values in accordance with selections of the sound function keys; and
   (2) providing the display with a means for indicating an operation state of the circuit.

19. The method of claim 15, further comprising the steps of:
   (1) providing a means for changing a sound signal into direct current; and
   (2) connecting said means between the microcomputer and the sound amplifier control circuit in a manner such that the microcomputer controls the sound amplifier control circuit.

20. The method of claim 15, further comprising the steps of:
   (1) connecting a transistor between the microphone and the multiplexer; and
   (2) providing the transistor with means for controlling an on and off operation of the microphone by signals generated within the multiplexer.

* * * * *